United States Patent [19]
Kamijo et al.

[11] Patent Number: 5,032,535
[45] Date of Patent: Jul. 16, 1991

[54] METHOD OF MANUFACTURING SEMICONDUCTOR DEVICE

[75] Inventors: Hiroyuki Kamijo; Toshiro Usami, both of Yokohama; Yuuichi Mikata, Kawasaki, all of Japan

[73] Assignee: Kabushiki Kaisha Toshiba, Kawasaki, Japan

[21] Appl. No.: 341,175

[22] Filed: Apr. 21, 1989

[30] Foreign Application Priority Data

Apr. 26, 1988 [JP] Japan ............... 63-103518

[51] Int. Cl.⁵ ............... H01L 21/336
[52] U.S. Cl. ............... 437/44; 437/27; 437/28; 437/29; 437/30; 437/41; 437/233; 437/191; 437/186; 357/23.3
[58] Field of Search ............... 437/27, 28, 29, 30, 437/40, 41, 44, 186, 233, 191; 357/23.3, 23.5, 23.4

[56] References Cited

U.S. PATENT DOCUMENTS

| | | | |
|---|---|---|---|
| 4,530,150 | 7/1985 | Shirato | 437/44 |
| 4,663,645 | 5/1987 | Komori et al. | 357/23.3 |
| 4,727,038 | 2/1988 | Watabe et al. | 437/29 |
| 4,788,663 | 11/1988 | Tanaka et al. | 357/23.5 |
| 4,818,714 | 4/1989 | Haskell | 437/44 |
| 4,818,715 | 4/1989 | Chao | 437/186 |
| 4,837,180 | 6/1989 | Chao | 437/186 |
| 4,906,589 | 3/1990 | Chao | 437/186 |
| 4,963,504 | 10/1990 | Huang | 437/44 |

FOREIGN PATENT DOCUMENTS

| | | |
|---|---|---|
| 0218408 | 4/1987 | European Pat. Off. |
| 3813665 | 11/1988 | Fed. Rep. of Germany |
| 0181378 | 7/1988 | Japan ............... 437/233 |
| 0007564 | 1/1989 | Japan |
| 013365 | 5/1989 | Japan |
| 0133366 | 5/1989 | Japan |

OTHER PUBLICATIONS

Izawa et al, "The Impact of Gate-Drain Overlapped LDD (GOLD) for Deep Submicron VLSI's", IEDM, 12/1987, pp. 38-41.

Izawa et al, "Ipact of the Gate-Drain Overlapped Device (GOLD) for Deep Submicron VLSI", IEEE Trans. on Electron Devices, vol. 35, No. 12, Dec. 1988, pp. 2088-2093.

Huang et al, "A Novel Submicron LDD Transistor with Inverse-T Gate Structure", IEDM, 1986, pp. 742-745.

Pfiester et al., "A Self-Aligned LDD/Channel Implanted ITLDD Process with Selectively-Deposited Poly Gates for CMOS VLSI", IEDM 1989, pp. 769-772.

Bassous et al, "Self-Aligned Polysilicon Gate MOSFETs with Tailored Source and Drain Profiles", IBM Tech. Discl. Bulletin, vol. 22, No. 11, 4/1980, pp. 5146-5147.

Oh et al., "Simultaneous Formation of Shallow-Deep Source/Drain for Submicron CMOS", 1988 Sym. on VLSI Technology, pp. 73-74.

*Primary Examiner*—Olik Chaudhuri
*Assistant Examiner*—M. Wilczewski
*Attorney, Agent, or Firm*—Finnegan, Henderson, Farabow, Garrett, and Dunner

[57] ABSTRACT

In the selective etching by RIE, a poly-Si film formed on the gate oxide film is not entirely removed such that the poly-Si film is partly left unremoved. Then, the entire surface is covered with a poly-Si film, followed by applying RIE. The particular technique permits preventing the gate oxide film near a poly-Si gate and the interface between the gate oxide film and the substrate from being damaged. Finally, a chemical dry etching, which does not do damage to the gate insulation film near the poly-Si gate, is applied to remove the poly-Si film.

6 Claims, 7 Drawing Sheets

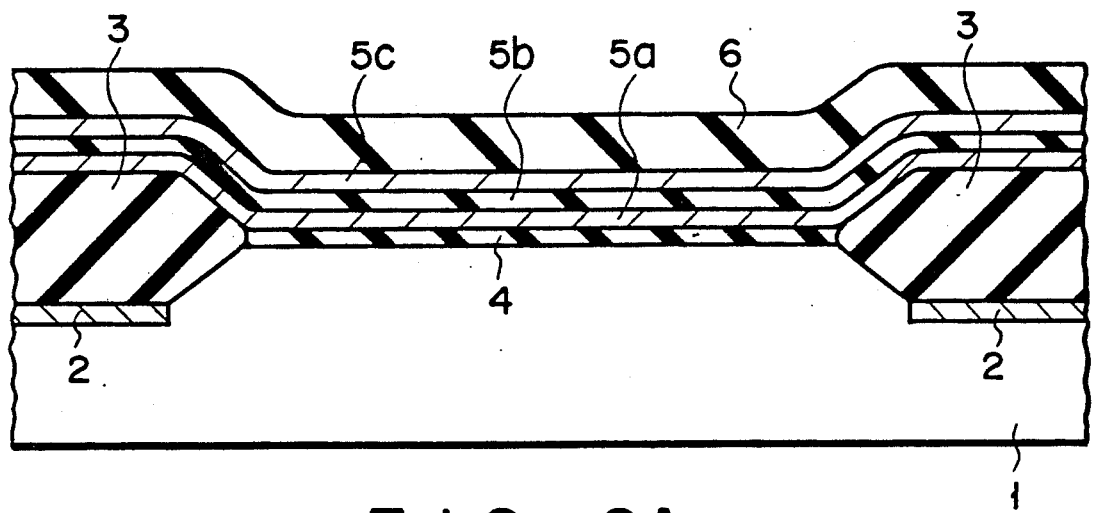
F I G. 2A
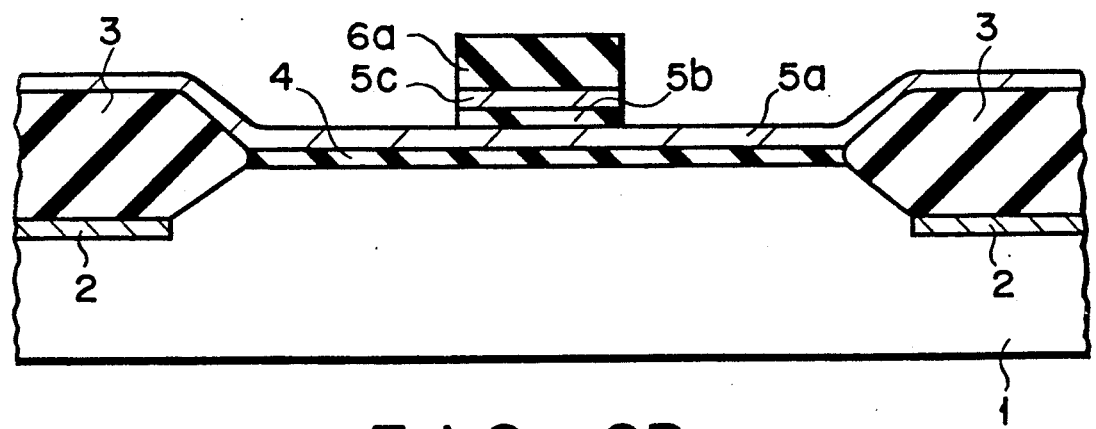
F I G. 2B

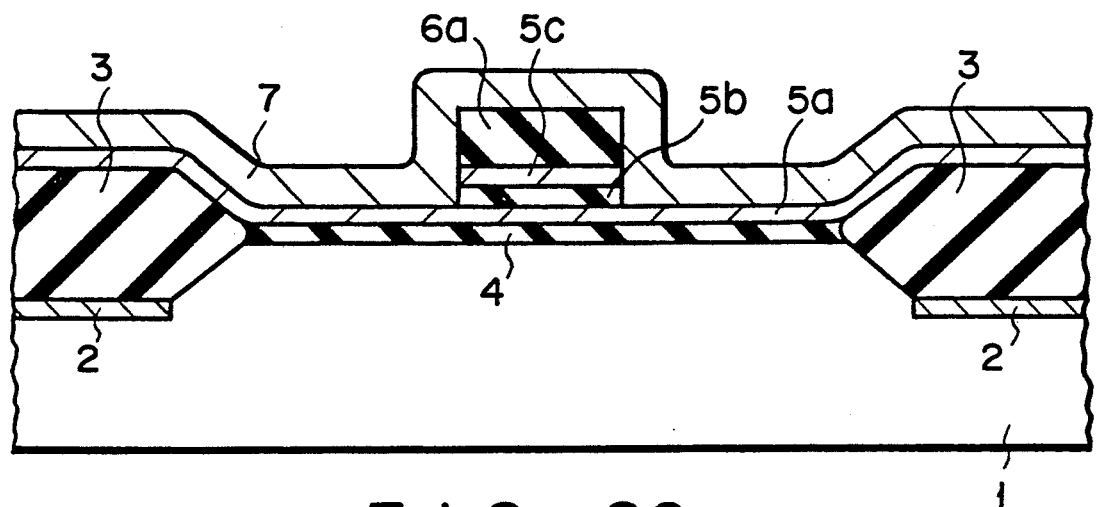
F I G. 2C
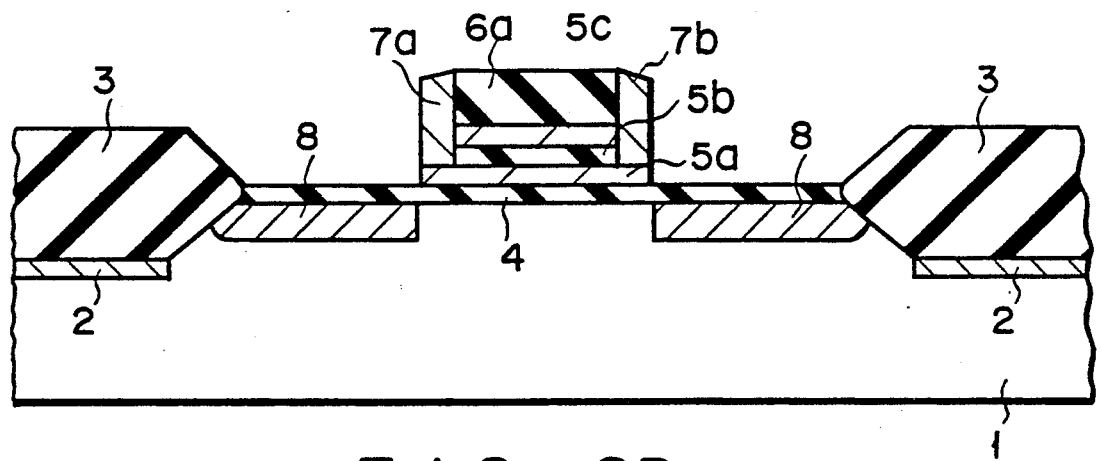
F I G. 2D
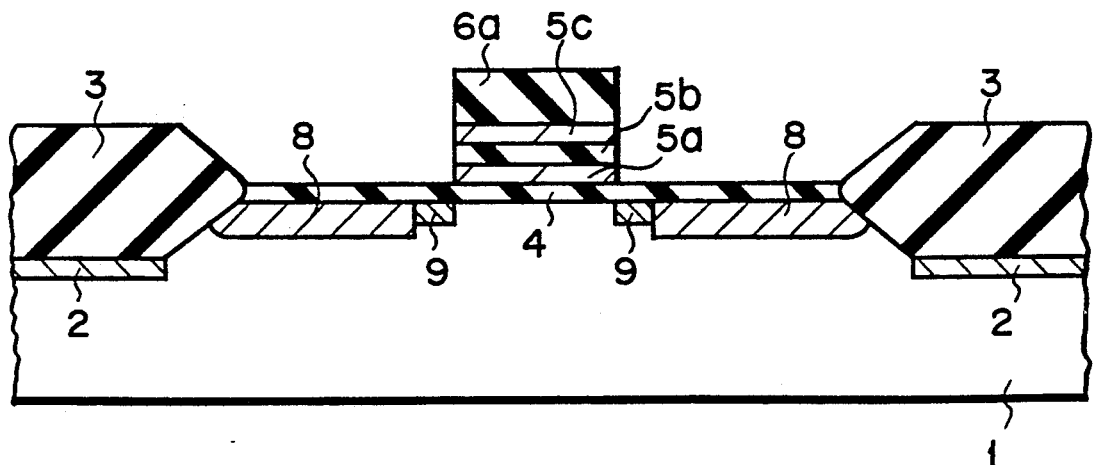
F I G. 2E

METHOD OF MANUFACTURING SEMICONDUCTOR DEVICE

BACKGROUND OF THE INVENTION

1. Field of the Invention

The present invention relates to a method of manufacturing a semiconductor device, particularly, a MOSFET of LDD structure.

2. Description of the Related Art

Recently, a poly-Si gate is widely used in MOSFETs. In general, RIE which permits a high processing accuracy is employed in general for forming the poly-Si gate in view of the demand for miniaturization of the MOSFET.

FIGS. 1A to 1G collectively show a conventional method of manufacturing a MOSFET by employing RIE. In the first step, an oxide film (not shown) is formed on a p-type silicon substrate 41, followed by forming a silicon nitride film (not shown) on the oxide film. The silicon nitride film is patterned by RIE, followed by implanting boron ions into the substrate using the silicon nitride pattern as a mask so as to form a channel-stopping region 42. A selective oxidation is then applied to form a field oxide film 43 on the region 42, followed by removing the oxide film and the silicon nitride film formed previously (FIG. 1A).

In the next step, a gate oxide film 44 is formed on the silicon substrate 41 (FIG. 1B). After formation of the gate oxide film, a poly-Si film 45 is deposited on the entire surface and, then, doped with an impurity (FIG. 1C). The poly-Si film 45 is selectively etched by RIE to form a poly-Si pattern 45a which finally acts as a gate electrode (FIG. 1D). Further, a resist pattern 46 is formed to cover the poly-Si pattern 45a (FIG. 1E). Then, As ions are implanted into the substrate using the resist pattern 46 as a mask, so as to form source and drain regions 47. After formation of the source and drain regions, the resist pattern 46 is removed (FIG. 1F), followed by implanting phosphorus (P) ions into the substrate at a low concentration using the poly-Si pattern 45a as a mask so as to form diffusion regions 48 of a low phosphorus concentration. Since the poly-Si pattern 45a is used as a mask, the ion implantation is performed by self-alignment. The diffusion regions 48 thus formed serve to achieve an electric connection between the source and drain regions 47 and the channel region so as to form a MOSFET of an LDD structure (FIG. 1G).

RIE, which permits a high processing accuracy, is suitable for use in the formation of a poly-Si gate in a finely miniaturized MOSFET. The etching function of RIE is based on both the chemical reaction involving plasma and the physical effect produced by the ion bombardment. Thus, in the selective etching, which employs RIE, of the poly-Si film 45 shown in FIG. 1C, various energized particles within the plasma such as ions, electrons and photons do damage to the gate oxide film near the poly-Si gate and to the interface between the gate oxide film and the substrate. The damage is caused by, for example, the dislocation in the arrangement of atoms, which is derived from the impact of the energized ion bombardment. The damage also includes the generation of electron-hole pairs, which accompanies the formation of primary ions within the gate oxide film, said primary ions being caused by far ultraviolet rays coming from the plasma or by soft X-rays generated from the counter electrode. Further, the electrons generated by the dislocation in the arrangement of atoms or by the formation of the primary ions serve to form secondary ions, with the result that the secondary ions and the defect in the gate oxide film perform a mutual function. These damages done to the gate oxide film and to the interface between the gate oxide film and the substrate result in a low reliability of the MOSFET. In many cases, these damages can be recovered by an annealing treatment. However, no effective means for recovery is available with respect to the damage which cannot be recovered by the annealing treatment.

As described above, the method of manufacturing a semiconductor device shown in FIG. 1 comprises a step of forming a poly-Si gate for a MOSFET by means of RIE, with the result that the gate oxide film and the interface between the gate oxide film and the substrate are directly exposed to various particles generated in the step of RIE. It follows that the conventional method shown in FIG. 1 is defective in that various damages are done to the gate oxide film near the poly-Si gate and to the interface between the gate oxide film and the substrate.

SUMMARY OF THE INVENTION

An object of the present invention is to provide a method of manufacturing a semiconductor device, which permits employing an anisotropic etching such as RIE for forming a poly-Si gate without doing damage to the gate oxide film near the poly-Si gate and to the interface between the gate oxide film and the substrate so as to manufacture a MOSFET of high reliability.

According to the present invention, there is provided a method of manufacturing a semiconductor device including a MOSFET; comprising the steps of:

(a) forming a gate insulation film 4 on a semiconductor substrate 1;

(b) forming a first film 5a, which constitutes a part of a gate electrode, on the gate insulation film;

(c) forming a film including at least a second film 5b, said second film being formed on the first film, differing from said first film in etching properties, and constituting a part of the gate electrode; including said second film;

(e) forming an insulation film pattern 6a by selectively removing said insulation film;

(f) selectively removing the film including the second film 5b by anisotropic etching using the insulation film pattern as a mask;

(g) forming a fourth film 7 to cover the first film as well as the upper and side surfaces of the insulation film pattern;

(h) applying an anisotropic etching to the fourth film 7 and the first film 5a to allow the fourth film 7 to remain on the insulation film pattern and on the side surfaces of the film including the second film and to allow the first film to remain below the residual fourth film;

(i) forming a diffusion region;

(j) removing the residual fourth film and the first film positioned below the fourth film by isotropic etching; and (k) forming a diffusion region of a low impurity concentration.

The present invention also provides a method of manufacturing a semiconductor device including a MOSFET, comprising the steps of:

(A) forming a gate insulation film 4 on a semiconductor substrate 1;
(B) forming a first film 10, which constitutes a part of a gate electrode, on the gate insulation film;
(C) forming an insulation film 11 on the first film;
(D) forming an insulation film pattern 11i a by selectively removing said insulation film;
(E) removing the first film to a predetermined thickness by anisotropic etching using the insulation film pattern as a mask;
(F) forming a second film to cover the upper and side surfaces of the first film and the upper and side surfaces of the insulation film pattern;
(G) applying an anisotropic etching to the second and first films to allow the second film to remain on the insulation film pattern and on the side surfaces of the first film and to allow the first film to remain below the residual second film;
(H) forming a diffusion region acting as a source or drain region;
(I) removing the residual second film and the first film positioned below the second film by isotropic etching; and
(J) forming a diffusion region of a low impurity concentration constituting a part of the source or drain region.

In the present invention, an anisotropic etching such as RIE, which permits an excellent processing accuracy, is not employed in the final step, and the anisotropic etching is applied in a manner to allow a film to remain partly on the gate oxide film. Then, an isotropic etching is applied in the final step so as to form a gate electrode in the manufacture of a MOSFET. What should be noted is that RIE is not directly applied to the gate insulation film near the gate electrode, making it possible to prevent various damages caused by RIE from being done to the gate insulation film near the gate electrode. It follows that the present invention permits forming a MOSFET of high reliability.

BRIEF DESCRIPTION OF THE DRAWINGS

FIGS. 2A to 2E are cross sectional views collectively showing a method of manufacturing a semiconductor device according to one embodiment of the present invention;

DETAILED DESCRIPTION OF THE PREFERRED EMBODIMENTS

Figure 1A:
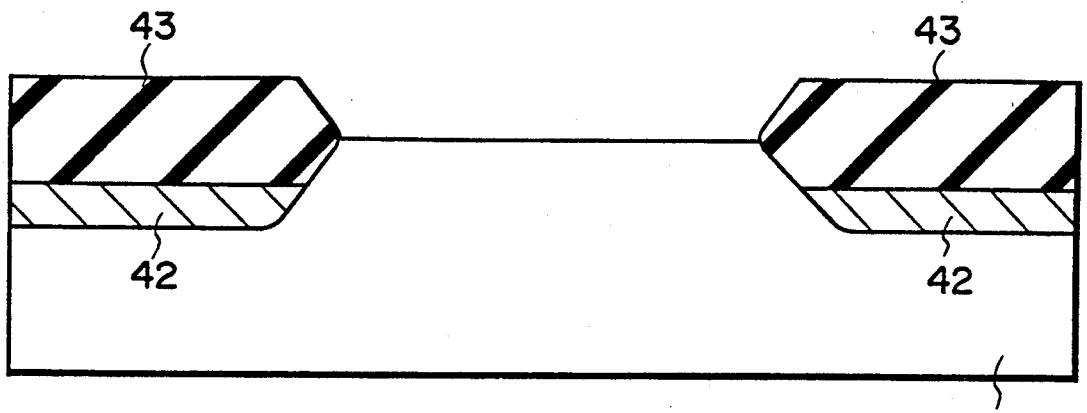
FIGS. 1A to 1G are cross sectional views collectively showing a conventional method of manufacturing a semiconductor device.
Figure 1B:
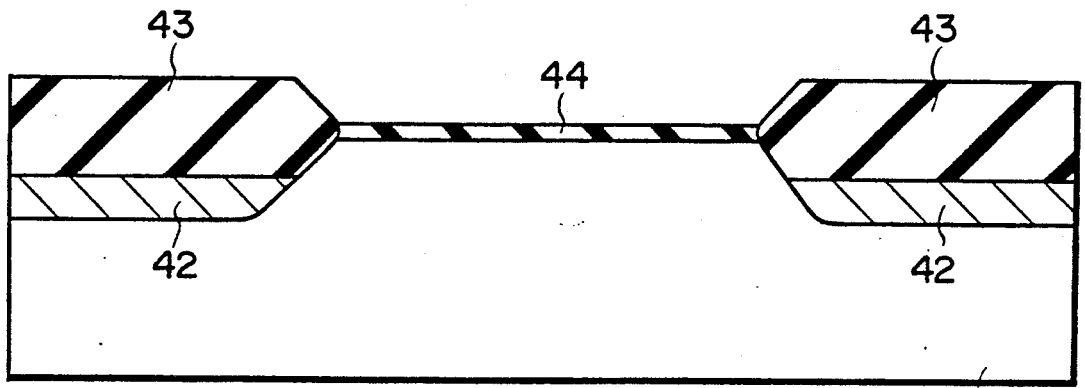
Figure 1C:
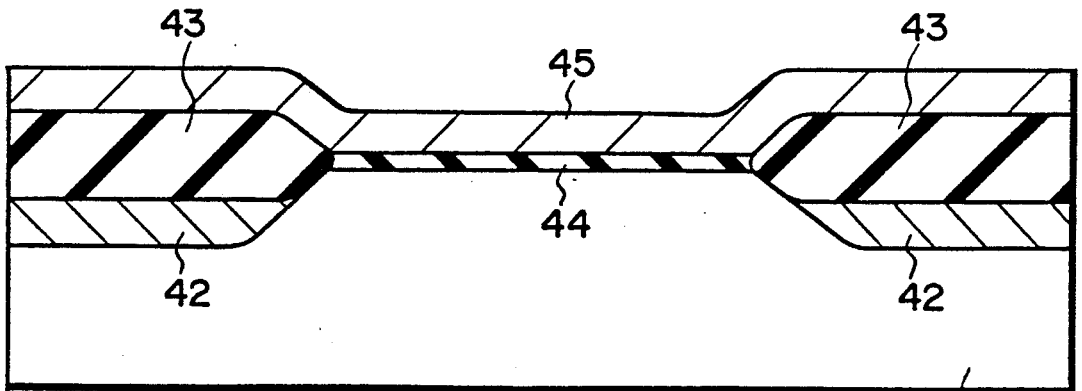
Figure 1D:
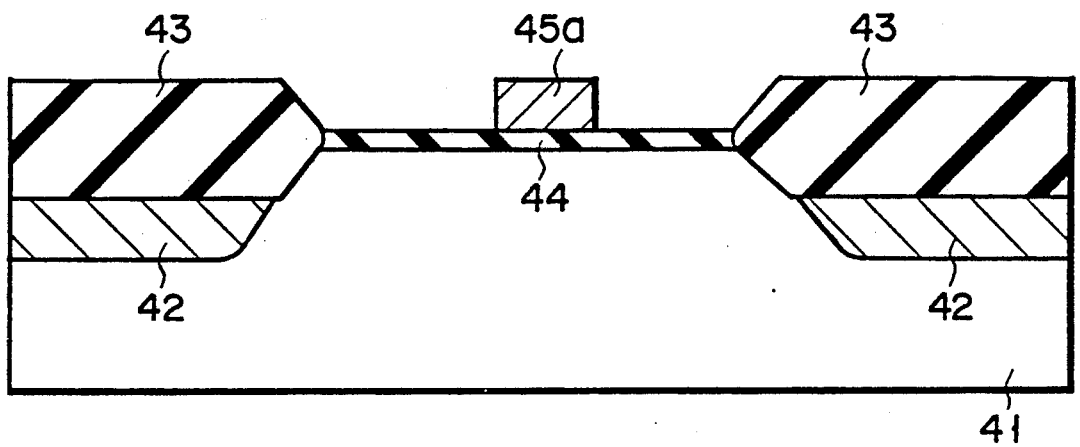
Figure 1E:
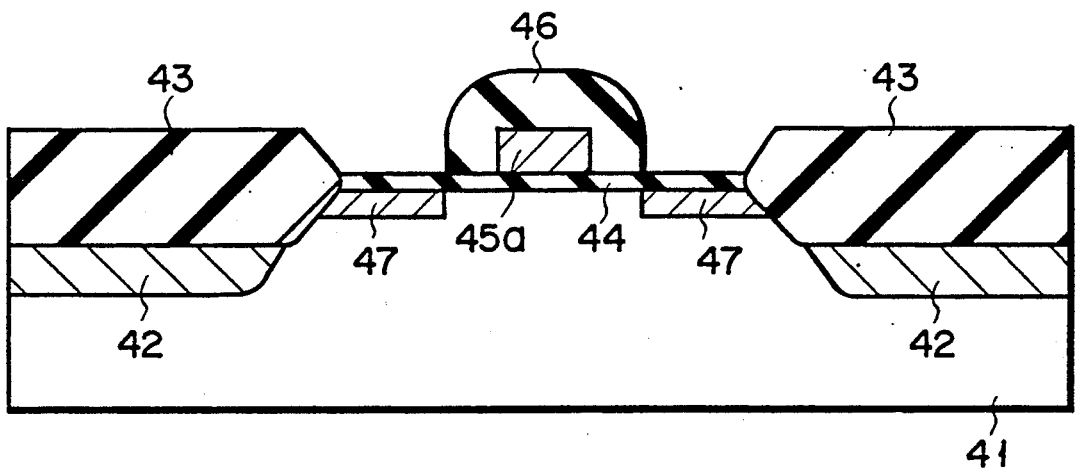
Figure 1F:
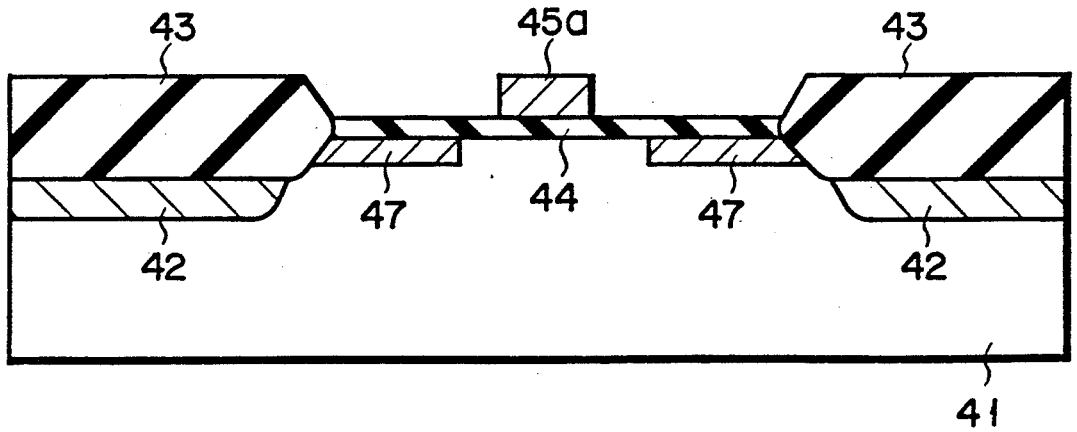
Figure 1G:
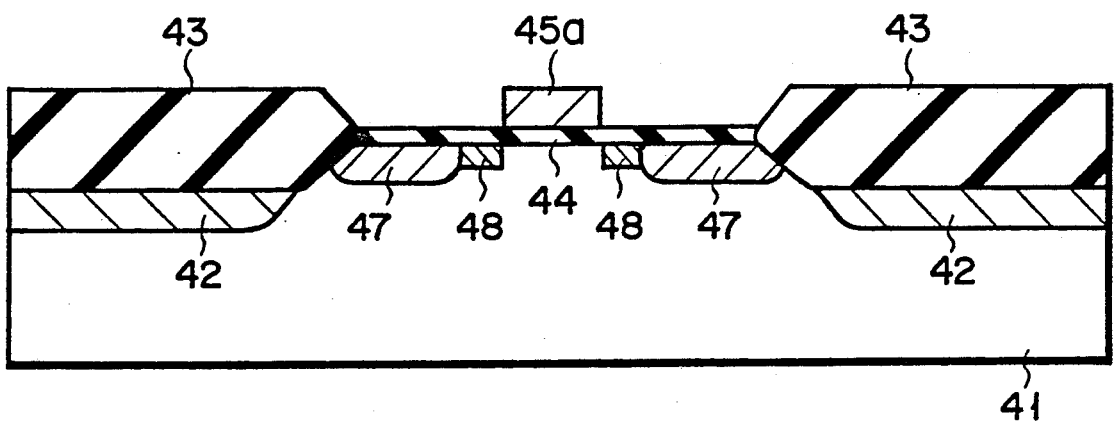

FIGS. 2A to 2E collectively show a method of manufacturing a MOSFET according to one embodiment of the present invention. For preparing the structure shown in FIG. 2A, an oxide film (not shown) is formed first on a p-type silicon substrate 1, followed by forming a $Si_3N_4$ film (not shown) on the oxide film. The $Si_3N_4$ film is then patterned by means of RIE, followed by implanting boron ions into the substrate using the $Si_3N_4$ film pattern as a mask so as to form a channel stop region 2. After formation of the channel stop region 2, a field oxide film 3 is formed in a thickness of about 10,000 Å on the channel stop region 2 by selective oxidation. Then, the oxide film and the $Si_3N_4$ film formed previously are removed, followed by forming a gate oxide film 4 in a thickness of about 300 Å. Further, a poly-Si film (first film) 5a doped with phosphorus is deposited on the entire surface in a thickness of 500 Å to 1,500 Å, desirably, about 1,000 Å. Still further, second and third films are formed on the first film 5a. To be more specific, a $Si_3N_4$ film (second film) 5b is formed on the first film in a thickness of 10 Å to 100 Å desirably, about 50 Å, followed by forming on the $Si_3N_4$ film 5b a poly-Si film (third film) 5c doped with phosphorus in a thickness of, desirably, about 3000 Å. The total thickness of these first to third films is preferably 3,000 Å to 4,500 Å. more preferably about 4,000 Å. These poly-Si films 5a, 5c may be formed by depositing pure poly-Si first, followed by diffusing phosphorus thereinto. Further, a $SiO_2$ film (insulation film) 6 is deposited in a thickness of about 4000 Å on . the poly-Si film 5c so as to prepare the structure shown in FIG. 2A.

In the next step, an anisotropic etching is applied using a resist pattern (not shown) as a mask so as to form a pattern 6a of the $SiO_2$ film. The resist pattern is then removed, followed by selectively removing the poly-Si film 5c by an anisotropic etching using the $SiO_2$ pattern 6a as a mask. Then, the $Si_3N_4$ film 5b is selectively removed. In this step, the poly-Si film 5a is left unremoved, as shown in FIG. 2B. Further, a poly-Si film (fourth film) 7 is deposited on the entire surface as shown in FIG. 2C. After formation of the poly-Si film 7, the poly-Si films 7 and 5a are anisotropically etched by, for example, RIE so as to form side-walls 7a, 7b consisting of the residual poly-Si film 7. Then, As ions are implanted by self-alignment at a dose of $1 \times 10^{15}$ $cm^{-2}$ under an accelerating energy of 70 KeV so as to form diffusion regions 8 acting as source and drain regions, respectively, as shown in FIG. 2D. Further, the side walls 7a, 7b and the poly-Si films 5a directly below these side walls are removed by an isotropic etching such as a chemical dry etching. Finally, phosphorus ions are implanted at a dose of $1.5 \times 10^{13}$ $cm^{-2}$ under an accelerating energy of 50 KeV to form diffusion regions 9 of a low impurity concentration, said diffusion region 9 serving to achieve an electrical connection between the diffusion region 8 and the channel region, thereby producing a MOSFET of an LDD structure as shown in FIG. 2E.

Another method employed for forming the diffusion regions 8 and 9, for example, comprises the step of implanting a low concentration of phosphorus ions under the state shown in FIG. 2B after selective removal of the poly-Si film 5c and the $Si_3N_4$ film 5b, and the step of implanting a high concentration of As ions under the state shown in FIG. 2C after formation of the poly-Si film 7, or under the state shown in FIG. 2D after formation of the side walls 7a, 7b. Further method for forming the diffusion regions 8 and 9 comprises the step of implanting a high concentration of As ions under the state shown in FIG. 2C after formation of the poly-Si film 7, and the step of implanting a low concentration of phosphorus after removal of the side walls 7a, 7b, and poly-Si film 5a therebeneath by an isotropic etching.

In the embodiment described above, it is possible to form an LDD structure on the basis of self-alignment. In addition, an isotropic etching, which does not invite the various damages described previously, is employed in the final step of the gate electrode formation. Thus, the gate insulation film near the gate electrode is free from the damages done by the anisotropic etching. What is also be noted is that the embodiment of FIG. 2 permits etching the poly-Si film 5c and the $Si_3N_4$ film 5b only so as to allow the poly-Si film 5a to remain on the gate insulation film easily and without fail. It is noted, however, that it is necessary to make the $Si_3N_4$ film 5b as thin as possible so as to suppress the detrimental effect produced by the film 5b.

Figure 3A:
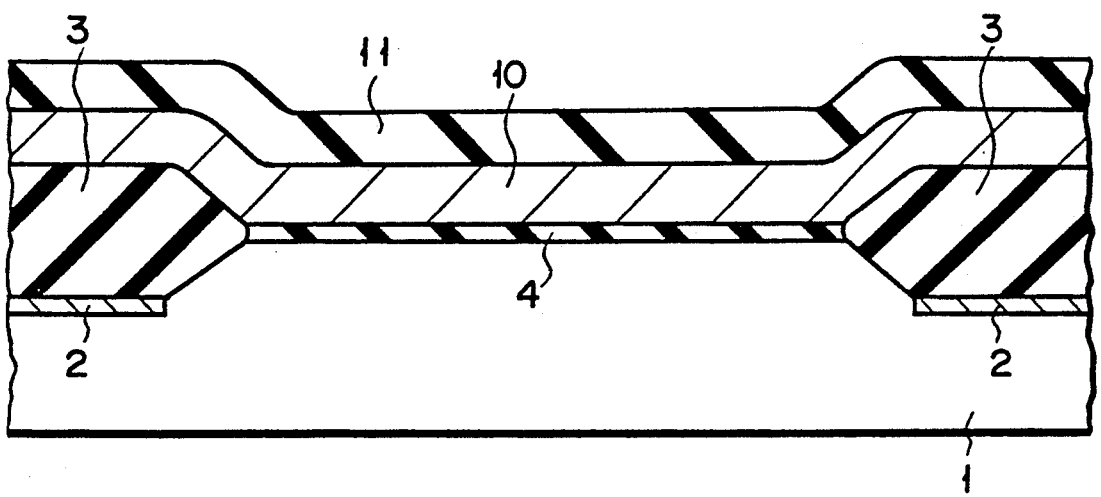
FIGS. 3A to 3E are cross sectional views collectively showing a method of manufacturing a semiconductor device according to another embodiment of the present invention.
Figure 3B:
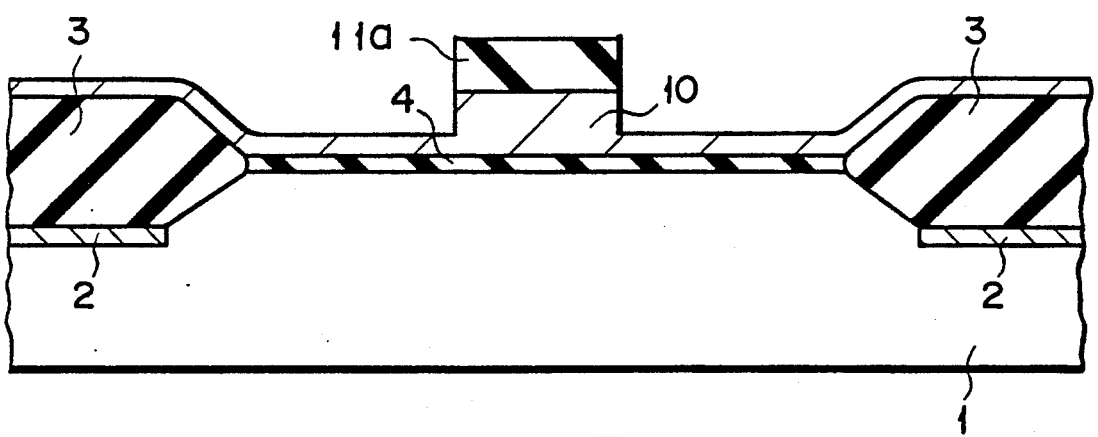
Figure 3C:
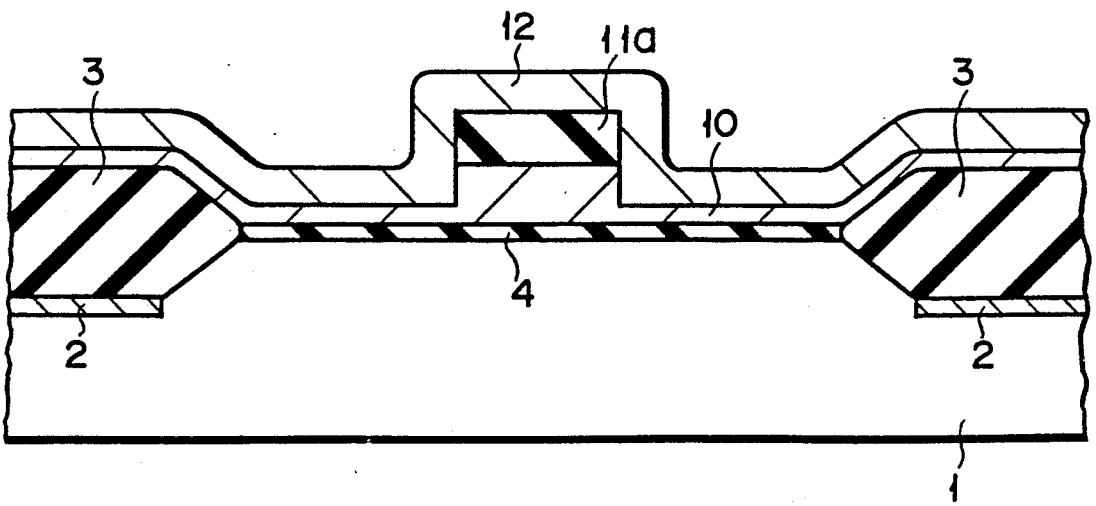
Figure 3D:
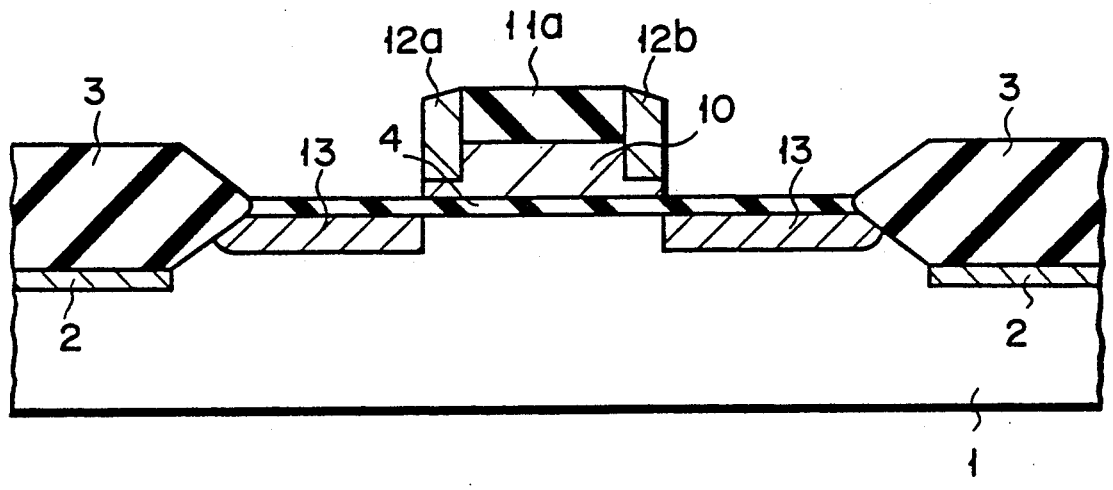
Figure 3E:
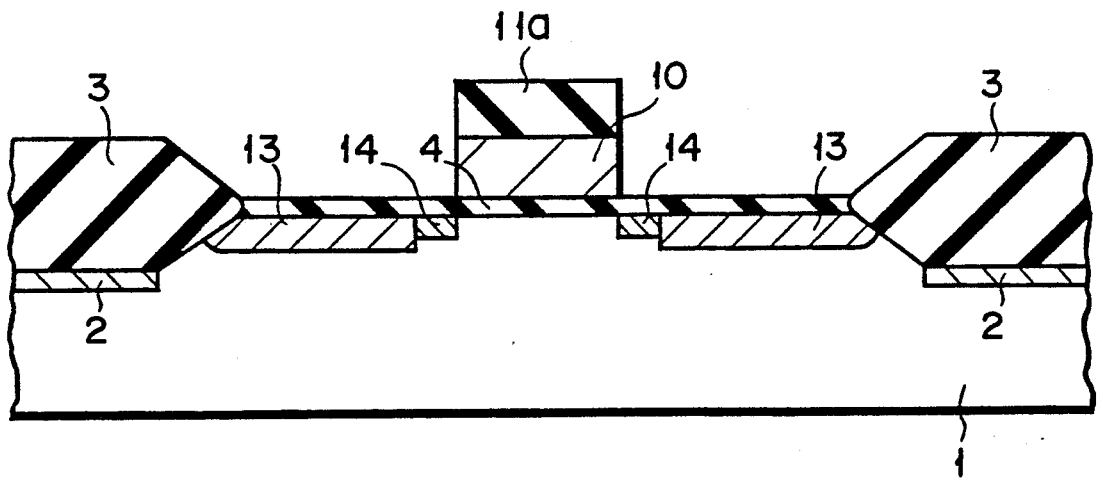

FIGS. 3A to 3E collectively show a method of manufacturing a MOSFET according to another embodiment of the present invention. It is noted that the reference numeral common with FIGS. 2 and 3 denote the same members of the device, which are prepared by the same methods. As seen from FIG. 3A, a channel stop region 2, a field oxide 3 and a gate oxide film 4 are formed on a p-type silicon substrate 1. Then, a poly-Si film (first film) 10 doped with phosphorus is deposited on the entire surface in a thickness of 3,000 Å to 4,500 Å, desirably about 4000 Å. Alternatively, the polY-Si film 10 may be formed by depositing first a pure poly-Si, which does not contain an impurity, followed by thermal diffusion of phosphorus into the poly-Si film. After formation of the poly-Si film 10, a $SiO_2$ film (insulation film) 11 is deposited on the poly-Si film 10 in a thickness of about 4,000 Å so as to prepare a structure as shown in FIG. 3A. The $SiO_2$ film 11 thus formed is selectively removed by an anisotropic etching using a resist pattern (not shown) as a mask so as to form a pattern 11a of the $SiO_2$ film, followed by removing the resist pattern. Then, the poly-Si film 10 is partly removed by an anisotropic etching in a thickness of 2,500 Å to 4,000 Å, desirably about 3,000 Å, as shown in FIG. 3B. The pattern 11i a of the $SiO_2$ film is used as a mask in this anisotropic etching step. In the next step, a poly-Si film (second film) 12 is formed to cover the upper and side surfaces of the first film and the upper and side surfaces of the insulation film pattern, as shown in FIG. 3C. The poly-Si film 12 and the poly-Si film 10 formed previously are then removed by an anisotropic etching such as RIE so as to form side walls 12a, 12b consisting of the residual poly-Si film 12. Further, As ions are implanted based on self-dose of $1 \times 10^{15}$ cm$^{-2}$ so as to form diffusion regions 13 acting as source and drain regions, respectively, as shown in FIG. 3D. Still further, the side walls 12a, 12b and these portions of the poly-Si film 10 which are positioned below these side walls are removed by an isotropic etching such as a chemical dry etching. Finally, phosphorus ions are implanted under an accelerating energy of 50 KeV and at a dose of $1.5 \times 10^{13}$ cm$^{-2}$ so as to form diffusion regions 14 of a low impurity concentration, thereby producing a MOSFET of an LDD structure, as shown in FIG. 3E.

Another method employed for forming the diffusion regions 13 and 14 comprises the step of implanting a low concentration of phosphorus ions under the state of FIG. 3B after relative removal of the poly-Si film 10 by an anisotropic etching in a thickness of about 3000 Å using the pattern of the $SiO_2$ film 11 as a mask, and the step of implanting a high concentration of As ions under the state shown in FIG. 3C after formation of the poly-Si film 12, or under the state shown in FIG. 3D after formation of the side walls 12a, 12b. Further method for forming the diffusion regions 13 and 14 comprises the step of implanting a high concentration of As ions under the state shown in FIG. 3C after formation of the poly-Si film 12 on the entire surface, and the step of implanting a low concentration of phosphorus ions under the state shown in FIG. 3E after removal of the side walls 12a, 12b, and those portions of the poly-Si film 10 which are positioned below these side walls by an isotropic etching.

Figure 4:
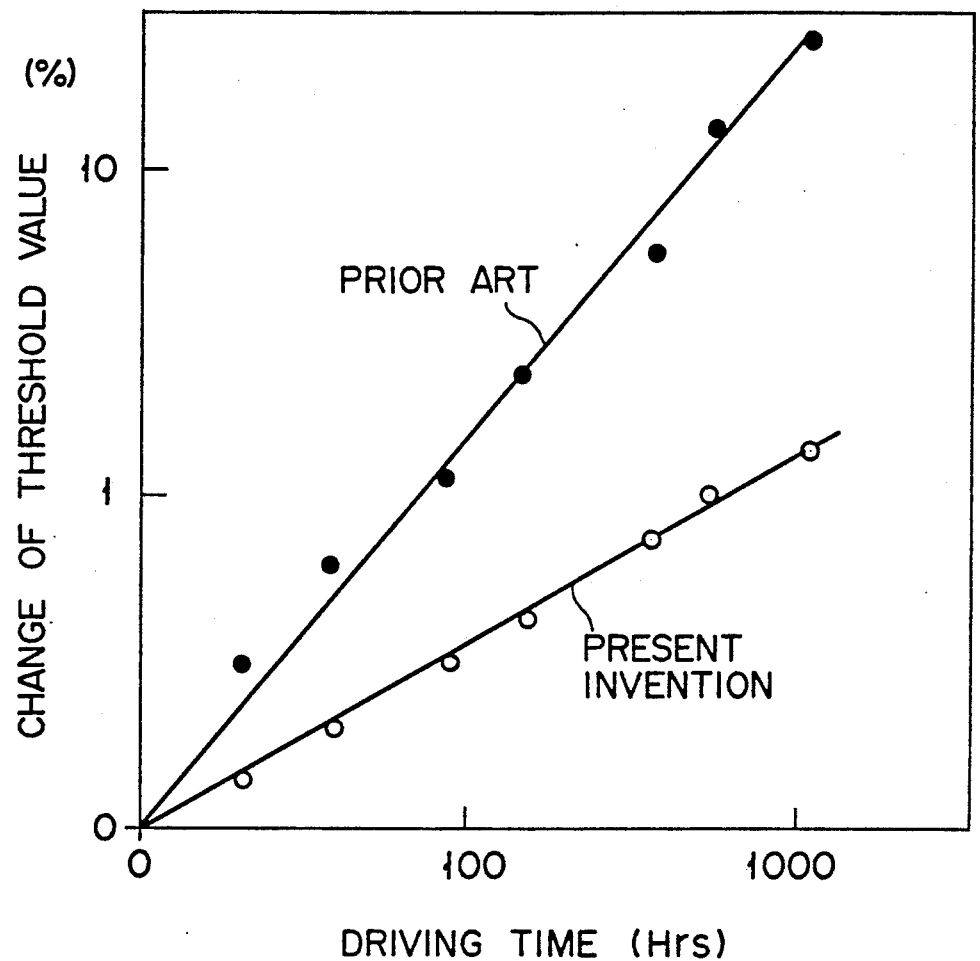
FIG. 4 is a graph comparing the MOSFET manufactured by the conventional method shown in FIG. 1 with the MOSFET manufactured by the method of the present invention with respect to the change in the threshold value relative to the driving time.

The method of manufacturing a MOSFET described above permits forming an LDD structure by self-alignment. It is also noted that an isotropic etching is employed in the final etching step in the formation of the poly-Si gate, making it possible to prevent the gate insulation film near the poly-Si gate from damages. In the embodiment of FIG. 3, it is necessary to set the etching conditions strictly in the etching step of the poly-Si film 10 so as to allow a part of the poly-Si film 10 to remain unremoved without fail, though the produced semiconductor device exhibits good characteristics because a $Si_3N_4$ film is not interposed. Experiment Changes in the threshold voltage relative to the driving time were measured with respect to a MOSFET manufactured by the conventional method shown in FIG. 1 and a MOSFET manufactured by the method of the present invention shown in FIG. 2. The channel length of the MOSFET tested was 2.0 mm. Also, the MOSFET was driven for 1000 hours under the gate voltage of 5V and the drain voltage of 5V, and the threshold voltage was measured 7 times during the driving period for each MOSFET. FIG. 4 shows the result.

As seen from FIG. 4, the change in the threshold voltage after the driving for 1000 hours is more than 10% in the MOSFET manufactured by the conventional method shown in FIG. 1 in contrast to only about 1% in the MOSFET manufactured by the method of the present invention. This clearly supports that the MOSFET manufactured by the method of the present invention is highly reliable.

What is claimed is:

1. A method of manufacturing a semiconductor device including a MOSFET of an LDD structure, comprising the steps of:
   (a) forming a gate insulation film on a semiconductor substrate;
   (b) forming a first film on the gate insulation film, said first film constituting a part of a gate electrode;
   (c) forming a film including at least a second film, said second film being formed on the first film, differing from said first film in etching properties, and constituting a part of the gate electrode;
   (d) forming an insulation film on the film including the second film;
   (e) forming an insulation film pattern by selectively removing said insulation film;
   (f) selectively removing the film including the second film by an anisotropic etching using the insulation film pattern as a mask;
   (g) forming a fourth film to cover the first film as well as the upper and side surfaces of the insulation film pattern;
   (h) applying an anisotropic etching to selectively remove the fourth film and the first film to allow the fourth film to remain on the insulation film pattern and on the side surfaces of the film including the second film and to allow the first film to remain below the remains fourth film;
   (i) forming a diffusion region;
   (j) removing the residual fourth film and the first film below the fourth film by isotropic etching; and (k) forming a diffusion region of a low impurity concentration.

2. The method of manufacturing a semiconductor device according to claim 1, wherein the step (c) for forming a film including at least a second film includes the step of forming said second film on the first film and the step of forming a third film having an electrical conductivity on the second film, said third film differing in etching properties from the second film, and the first film has a thickness of 500 to 1,500 Å, the second film has a thickness of 10 to 100 Å, and the total thickness of the first, second and third films is 3,000 to 4,500 Å.

3. The method of manufacturing a semiconductor device according to claim 1, wherein the step of forming the diffusion region is performed after step (h) for forming the fourth film using the residual fourth film after step (g) as a mask, and the step of forming a diffusion region of a low impurity concentration is performed after step (j) of removing the fourth film and the first film positioned below the fourth film.

4. The method of manufacturing a semiconductor device according to claim 1, wherein the steps (i) and (k) for forming the diffusion region and the diffusion region of a low impurity concentration comprise the step of implanting a low concentration of phosphorus ions after step (f) for selectively removing the film including the second film and the step of implanting a high concentration of As ions after step (g) for forming a fourth film.

5. The method of manufacturing a semiconductor device according to claim 1, wherein the steps (i) and (k) for forming the diffusion region and the diffusion region of a low impurity concentration comprise the step of implanting a high concentration of As ions after step (g) for forming a fourth film and the step of implanting a low concentration of phosphorus ions after step (f) for removing the fourth film and the first film positioned below the fourth film.

6. The method of manufacturing a semiconductor device according to claim 1, wherein the anisotropic etching is a reactive ion etching (RIE) and the isotropic etching is a chemical dry etching.

* * * * *